US011132525B2

(12) United States Patent
Li et al.

(10) Patent No.: US 11,132,525 B2
(45) Date of Patent: Sep. 28, 2021

(54) LIGHT INTENSITY DETECTING UNIT, DISPLAY PANEL, AND METHOD FOR DETECTING LIGHT INTENSITY

(71) Applicant: BOE Technology Group Co., Ltd., Beijing (CN)

(72) Inventors: Dongsheng Li, Beijing (CN); Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 275 days.

(21) Appl. No.: 16/336,278

(22) PCT Filed: Sep. 17, 2018

(86) PCT No.: PCT/CN2018/105991
§ 371 (c)(1),
(2) Date: Mar. 25, 2019

(87) PCT Pub. No.: WO2019/134395
PCT Pub. Date: Jul. 11, 2019

(65) Prior Publication Data
US 2020/0380234 A1 Dec. 3, 2020

(30) Foreign Application Priority Data
Jan. 2, 2018 (CN) .......................... 201810003875.5

(51) Int. Cl.
G06K 9/00 (2006.01)
G01J 1/44 (2006.01)

(52) U.S. Cl.
CPC .............. G06K 9/0004 (2013.01); G01J 1/44 (2013.01); G01J 2001/446 (2013.01)

(58) Field of Classification Search
CPC ....... G06K 9/0002; G06K 9/0004; G01J 1/44; H01L 27/124
See application file for complete search history.

(56) References Cited

U.S. PATENT DOCUMENTS

2011/0157116 A1 6/2011 Shiraki et al.
2012/0313913 A1 12/2012 Shiraki et al.
(Continued)

FOREIGN PATENT DOCUMENTS

CN 102119408 A 7/2011
CN 103680385 A 3/2014
(Continued)

OTHER PUBLICATIONS

First Office Action and English language translation, CN Application No. 201810003875.5, dated May 15, 2020, 19 pages.

Primary Examiner — Kevin K Pyo
(74) Attorney, Agent, or Firm — Myers Bigel, P.A.

(57) ABSTRACT

A light intensity detecting unit, a display panel, and a method of detecting light intensity are provided. The light intensity detecting unit includes N scanning signal lines, J reading signal lines, at least one enable signal line, N×J photoelectric conversion circuits configured to convert optical signals into electric signals, and at least one gating circuit. Each of the reading signal lines is connected to one or more of at least one gating circuit. Each of the gating circuits is connected to output terminals of a plurality of photoelectric conversion circuits. Each of the scanning signal lines is connected to one or more photoelectric conversion circuits. Each of the enable signal line is connected to one or more of the at least one gating circuit. The gating circuit is configured to transmit the electric signal to the reading signal line in response to an enable signal from the enable signal line.

18 Claims, 8 Drawing Sheets

(56) References Cited

U.S. PATENT DOCUMENTS

| | | | |
|---|---|---|---|
| 2015/0242040 A1 | 8/2015 | Gu et al. | |
| 2016/0349882 A1 | 12/2016 | Liu et al. | |
| 2017/0083738 A1 | 3/2017 | Park et al. | |
| 2017/0161538 A1 | 6/2017 | Liu et al. | |
| 2018/0150668 A1* | 5/2018 | Li | H01L 29/78669 |

FOREIGN PATENT DOCUMENTS

| | | |
|---|---|---|
| CN | 104850292 A | 8/2015 |
| CN | 105095874 A | 11/2015 |
| WO | 2011/104957 A1 | 9/2011 |

* cited by examiner

LIGHT INTENSITY DETECTING UNIT, DISPLAY PANEL, AND METHOD FOR DETECTING LIGHT INTENSITY

CROSS REFERENCE TO RELATED APPLICATION

The present application is a 35 U.S.C. 371 national stage application of PCT International Application No. PCT/CN2018/105991, filed on Sep. 17, 2018, which claims the benefit of Chinese Patent Application No. 201810003875.5 filed on Jan. 2, 2018, the contents of which are incorporated herein by reference in their entireties.

FIELD

The present disclosure relates to the field of display technologies, and in particular, to a light intensity detecting unit, a display panel, and a method for detecting light intensity.

BACKGROUND

Photoelectric conversion elements are capable of collecting optical signals and can be used in the field of fingerprint identification. However, in the related art, the photoelectric conversion elements, the switching elements, and the wiring in light intensity detecting units may cause a problem of inaccurate fingerprint collection.

SUMMARY

According to an aspect of the present application, there is provided a light intensity detecting unit, comprising N scanning signal lines, wherein N is a positive integer; J reading signal lines, where J is a positive integer; at least one enable signal line; N×J photoelectric conversion circuits configured to convert optical signals into electric signals; and at least one gating circuit. Each of the reading signal lines is connected to one or more of the at least one gating circuit, each of the gating circuit is connected to output terminals of a plurality of the photoelectric conversion circuits, each of the scanning signal lines is connected to one or more of the photoelectric conversion circuits, and each of the enable signal line is connected to one or more of the at least one gating circuit. The gating circuit is configured to transmit the electric signal to the reading signal line connected to the gating circuit in response to an enable signal from the enable signal line connected to the gating circuit.

In some embodiments, the photoelectric conversion circuits connected to a same reading signal line is divided into K groups, wherein K is a positive integer greater than or equal to 2, and the photoelectric conversion circuits in each one of the groups are connected to a same gating circuit.

In some embodiments, in each of the groups of the photoelectric conversion circuits, each of the scanning signal lines is connected to only one of the photoelectric conversion circuits.

In some embodiments, each of the groups of the photoelectric conversion circuits consists of M photoelectric conversion circuits, wherein M is a positive integer.

In some embodiments, M=K.

In some embodiments, N is a positive integer greater than or equal to 3.

In some embodiments, the at least one gating circuit comprises a plurality of gating circuits, and the gating circuits connected to a same reading signal line are respectively connected to different enable signal lines.

In some embodiments, the at least one gating circuit comprises a plurality of gating circuits, and the gating circuits connected to a same enable signal line are respectively connected to different reading signal lines.

In some embodiments, each of the photoelectric conversion circuits comprises a first transistor and a photoelectric conversion element, wherein the first transistor comprises a gate electrode, a first electrode and a second electrode, and the gate electrode of the first transistor is connected to one of the scanning signal lines, the photoelectric conversion element is connected to the first electrode of the first transistor, the second electrode of the first transistor is the output terminal of the photoelectric conversion circuit. Each of the gating circuit comprises a second transistor, wherein the second transistor comprises a gate electrode, a first electrode and a second electrode, and the gate electrode of the second transistor is connected to one of the enable signal line, the first electrode of the second transistor is connected to the second electrode of the first transistor, and the second electrode of the second transistor is connected to one of the reading signal lines.

In some embodiments, the first transistor and the second transistor have a same width-to-length ratio.

In some embodiments, the photoelectric conversion element is a photodiode, and the first electrode of the first transistor is connected to an anode of the photodiode, and a cathode of the photodiode is connected to an operating voltage terminal.

In some embodiments, the enable signal line is parallel to the scanning signal line.

According to another aspect of the present application, there is provided a display panel comprising a fingerprint identification circuit comprising the light intensity detecting unit according to any one of the embodiments of the present application.

In some embodiments, the light intensity detecting unit is in a display area of the display panel.

In some embodiments, the display panel further comprises a gate line and a data line that are crisscrossed, wherein each of the scanning signal line, the reading signal line and the enable signal line is at a different layer than the gate line or the data line.

According to yet another aspect of the present application, there is provided a method of detecting light intensity by using a light intensity detecting unit. The light intensity detecting unit comprises N scanning signal lines, wherein N is a positive integer; J reading signal lines, where J is a positive integer; at least one enable signal line; N×J photoelectric conversion circuits configured to convert optical signals into electric signals; and at least one gating circuit. Each of the reading signal lines is connected to one or more of the at least one gating circuit, each of the gating circuits is connected to output terminals of a plurality of the photoelectric conversion circuits, each of the scanning signal line is connected to one or more of the photoelectric conversion circuits, and each of the enable signal line is connected to one or more of the at least one gating circuit. The gating circuit is configured to transmit the electric signal to the reading signal line connected to the gating circuit in response to an enable signal from the enable signal line connected to the gating circuit. The method comprises the following steps:

receiving the enable signal by the gating circuit to turn on the gating circuit, receiving a scanning signal by the photoelectric conversion circuit connected to the gating circuit to turn on the photoelectric conversion circuit, and transmitting the electric signal to the reading signal line by a turned-on photoelectric conversion circuit through a turned-on gating circuit.

In some embodiments, the step of receiving the scanning signal by the photoelectric conversion circuit connected to the gating circuit to turn on the photoelectric conversion circuit comprises receiving one by one, by the photoelectric conversion circuits connected to the gating circuit, the scanning signals transmitted by the scanning signal lines connected to the photoelectric conversion circuits, to turn on the photoelectric conversion circuits one by one.

In some embodiments, the step of transmitting the electric signal to the reading signal line by the turned-on photoelectric conversion circuit through the turned-on gating circuit comprises, after the photoelectric conversion circuits have received the scanning signals, transmitting, by the gating circuit, the electric signals to the reading signal line one by one or simultaneously.

In some embodiments, the step of receiving the enable signal by the gating circuit to turn on the gating circuit comprises inputting enable signals one by one to the gating circuits by the enable signal line to turn on the gating circuits one by one. In response to a plurality of gating circuits connected to the same enable signal line being turned on, the step of receiving the scanning signal by the photoelectric conversion circuit connected to the gating circuit to turn on the photoelectric conversion circuit comprises receiving one by one, by the photoelectric conversion circuits connected to the turned-on gating circuit, the scanning signals transmitted by the scanning signal lines connected to the photoelectric conversion circuits, to turn on the photoelectric conversion circuits one by one.

BRIEF DESCRIPTION OF THE DRAWINGS

In order to more clearly explain the technical solutions in the embodiments of the present disclosure or the related art, the drawings to be used in the description the embodiments or the related art will be briefly described below. Apparently, the drawings in the following description are only part of the embodiments of the present application. A person having ordinary skill in the art can obtain other drawings based on the disclosed drawings without paying creative effort. In the drawings, FIG. 1 schematically shows the structure of a light intensity detecting unit according to embodiments of the present disclosure.

DETAILED DESCRIPTION

The technical solutions according to the embodiments of the present disclosure will be described below with reference to the drawings. It is apparent that the described embodiments are only a part of the embodiments of the present disclosure, rather than all of them. All other embodiments obtained by a person having ordinary skill in the art based on the embodiments of the present disclosure without paying creative effort belong to the protection scope of the disclosure.

In the field of light intensity detection, it is known that photoelectric conversion elements are capable of collecting optical signals and converting the collected optical signals into electric signals. At present, the photoelectric conversion elements are widely used in the field of fingerprint identification. Normally, a photoelectric conversion element is connected to a signal line through a switching transistor. The switching transistor can control the photoelectric conversion element to output the collected fingerprint signal to the signal line. By processing the fingerprint signal, the shape of the fingerprint can be obtained.

However, the switching transistor itself involves a leakage current (i.e., the off-state current $I_{off}$). The off-state current is a relatively large current comparing with the fingerprint signal which is weak. Therefore, when the off-state current $I_{off}$ flows to the signal line, it will interfere with the fingerprint signal on the signal line, thereby resulting in an inaccurate fingerprint collection.

The present disclosure provides a light intensity detecting unit, a display panel, and a method for detecting light intensity, which can reduce the influence of the off-state current $I_{off}$ of the switching transistor on the detection accuracy of the light intensity.

Figure 1:
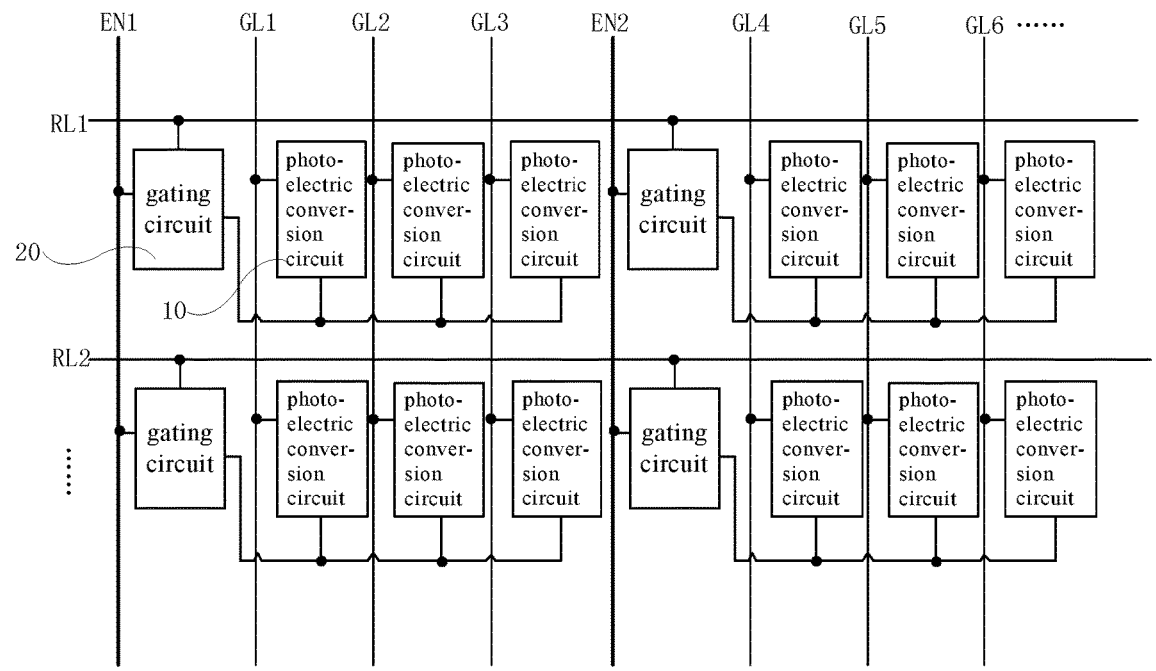

FIG. 1 schematically shows the structure of a light intensity detecting unit 01 according to embodiments of the present disclosure. As shown in FIG. 1, the light intensity detecting unit 01 comprises scanning signal lines GL, the quantity of which is N, and reading signal lines RL, the quantity of which is J. N and J are positive integers. The light intensity detecting unit 01 further comprises photoelectric conversion circuits 10, the quantity of which is N times J (i.e., N×J). That is, each one of the scanning signal lines GL defines a photoelectric conversion circuit 10 in combination with a respective one of the reading signal lines RL. That means, in a light intensity detecting unit 01, N photoelectric conversion circuits 10 are connected to the same reading signal line RL, and J photoelectric conversion circuits 10 are connected to the same scanning signal line GL.

Further, the light intensity detecting unit 01 further comprises at least one gating circuit 20. The output terminals of the plurality of photoelectric conversion circuits 10 are connected to the same reading signal line RL through one gating circuit 20. In addition, the light intensity detecting unit 01 further comprises an enable signal line EN, and the gating circuit 20 is also connected to the enable signal line EN. The gating circuit 20 is configured to turn on the gating circuit 20 in response to an enable signal from the enable signal line EN, thereby outputting the electric signals converted from the optical signals by the respective photoelectric conversion circuits 10 to the reading signal line RL one by one. In an embodiment, each of the photoelectric conversion circuits is connected to a corresponding one of the scanning signal lines and a corresponding one of the gating circuits, and is connected to a corresponding one of the reading signal lines through the corresponding one of the gating circuits. Meanwhile, each of the gating circuits is connected to a corresponding one of the enable signal lines and configured to transmit the electric signal to a corresponding one of the reading signal lines in response to the enable signal from a corresponding one of the enable signal lines. The term "corresponding" refers only to a connection relationship and does not act as a limitation in quantity. For example, the expression "each of the photoelectric conversion circuits is connected to a corresponding one of the gating circuits" means that each photoelectric conversion circuit would eventually be connected to a gating circuit, but does not mean that the photoelectric conversion circuit and the gating circuit have a one-to-one correspondence. For example, this expression may mean a case where a plurality of photoelectric conversion circuits are connected to the same gating circuit and another plurality of photoelectric conversion circuits are connected to another gating circuit. In addition, the expression "each of the photoelectric conversion circuits is connected to a corresponding one of the scanning signal lines" includes a case where a plurality of photoelectric conversion circuits are connected to the same scanning signal line, and the expression "each of the gating circuits is connected to a corresponding one of the enable signal line" includes a case where a plurality of gating circuits are connected to the same enable signal line.

In some embodiments, $N \geqslant 3$. That is to say, in a light intensity detecting unit 01, there are at least three scanning signal lines. In other words, each reading signal line can be connected to three or more photoelectric conversion circuits. In some embodiments, $J \geqslant 2$. That is to say, each scanning signal line can be connected to two or more photoelectric conversion circuits.

Figure 2:
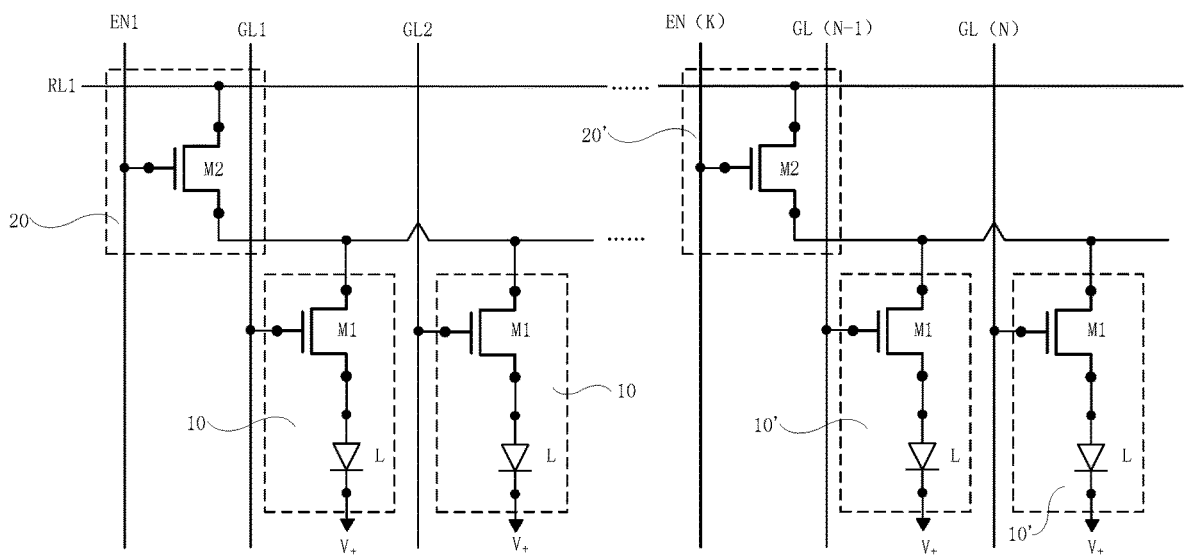
FIG. 2 schematically shows a wiring diagram of the photoelectric conversion circuits of FIG. 1.

In order to optimize the wiring space, optionally, the above mentioned enable signal line EN may be arranged in parallel with the scanning signal line GL. FIG. 2 schematically shows a wiring diagram of the photoelectric conversion circuits 10 of FIG. 1. As shown in FIG. 2, a photoelectric conversion circuit may comprise a first transistor M1 and a photoelectric conversion element L. The first transistor comprises a gate electrode, a first electrode, and a second electrode. The first electrode and the second electrode represent the source and the drain of the transistor. For example, in an embodiment, the first electrode is the source of the transistor and the second electrode is the drain of the transistor. Alternatively, in another embodiment, the first electrode is the drain of the transistor and the second electrode is the source of the transistor. In the photoelectric conversion circuit 10, the photoelectric conversion element L is connected to the first electrode of the first transistor M1. That is to say, the photoelectric conversion element L may be connected to the source of the first transistor M1, or may be connected to the drain of the first transistor M1. The second electrode of the first transistor is the output terminal of the photoelectric conversion circuit.

In some embodiments, the photoelectric conversion element L can be a photodiode (PIN diode). In this case, the first electrode of the first transistor M1 is connected to the anode of the photodiode, and the gate electrode of the first transistor M1 is connected to the scanning signal line GL. In addition, the cathode of the photodiode is connected to the operating voltage terminal $V_+$. The operating voltage terminal $V_+$ may have a magnitude between 5V and 8V, such that the PIN diode operates in a reverse bias state.

Alternatively, the above-mentioned photoelectric conversion elements L may also be elements capable of converting optical signals into electric signals, such as phototriodes, photo resistors, or the like, which is not limited in the present application.

For the convenience of description, in the embodiments of the present application, PIN diodes are taken as examples to specifically describe the photoelectric conversion elements L. In this case, the electric signals converted by the PIN diode from the optical signals are current signals. The current signals are output to the reading signal lines RL for the detection of light intensity. When the light intensity is strong, the current signals on the reading signal lines RL are large, and when the light intensity is weak, the current signals on the reading signal lines RL are small.

In some embodiments, the gating circuit 20 may comprises a second transistor M2. The second transistor M2 also includes a gate electrode, a first electrode and a second electrode. It should be noted that, the selection of the first electrode and the second electrode of the second transistor M2 is independent from the selection of the first electrode and the second electrode of the first transistor M1. For example, when the first transistor of the first transistor M1 is a source and the second electrode of the first transistor is a drain, the first electrode of the second transistor M2 may be a source and the second electrode of the second transistor may be the drain, or the first electrode of the second transistor M2 may be the drain and the second electrode of the second transistor may be the source. The gate electrode of the second transistor M2 is connected to the enable signal line EN. The first electrode of the second transistor M2 is connected to the second electrode of the first transistor M1, and the second electrode of the second transistor M2 is connected to the reading signal line RL. That is to say, one of the source and drain of the second transistor M2 is connected to the second electrode of the first transistor M1, and the other one of the source and drain of the second transistor M2 is connected to the reading signal line RL. It should be understood that the expression "one of the source and drain of the second transistor M2 is connected to the second electrode of the first transistor M1" means that one of the source and drain of the second transistor M2 is connected to one of the source and drain of the first transistor M1, and the other one of the source and drain of the first transistor M1 is connected to the photoelectric conversion element L.

It should be noted that the above mentioned first transistor M1 and second transistor M2 may both be N-type transistors (as shown in FIG. 2) or both P-type transistors, which is not limited by this application.

In this case, only when the second transistor M2 in the gating circuit 20 is turned on, can the first transistors M1 in the photoelectric conversion circuits 10 connected to the gating circuit 20 transmit the electric signals converted by the photoelectric conversion elements L connected to the first transistors M1 to the reading signal line RL connected to the turned-on second transistor M2. Therefore, part of the gating circuits 20 can be selectively turned on. For example, as shown in FIG. 2, under the control of the enable signal line EN1, the second transistor M2 of the gating circuit 20 connected to the enable signal line EN1 can be turned on to achieve the purpose of turning on the gating circuit 20. In this case, the plurality of photoelectric conversion circuits 10 connected to the same reading signal line RL1 by the gating circuit 20 can turn on the first transistors M1 in the photoelectric conversion circuits 10 under the control of the scanning signal lines GL, such that the photoelectric conversion elements L in the photoelectric conversion circuits 10 transmit the electric signals converted from the optical signals to the above-mentioned reading signal line RL1 through the turned-on first transistor M1 and the turned-on second transistor M2. At the same time, it is also possible to selectively turn off part of the gating circuits. For example, as shown in FIG. 2, under the control of the enable signal line EN(K), the second transistor M2 in the gating circuit 20' connected to the enable signal line EN(K) can be turned off to achieve the purpose of closing of the gating circuit 20'. K is a positive integer and in some embodiments, K⩾2. In this case, although the first transistors M1 in the photoelectric conversion circuits 10' respectively connected to the scanning signal line GL(N−1) and the scanning signal line GL(N) have leakage currents, the off-state current $I_{off}$ transmitted to the reading signal line RL1 can be limited by the second transistor M2 in the gating circuit 20' because the amount of the portion of the leakage current of the plurality of first transistors M1 connected to the second transistor M2 in the off-state circuit 20' that can flow to the reading signal line RL through the second transistor M2 is limited by the magnitude of the leakage current of the second transistor M2. Therefore, the influence of the current $I_{off}$ of each first transistor M1 on the electric signal on the reading signal line RL1 can be reduced, so as to improve the accuracy of the light intensity detecting unit 01.

It should be noted that the light intensity detecting unit 01 according to the embodiments of the present application can collect light. Meanwhile, the brightness of the collected light matches the strength of the resulted electric signal. Therefore, the light intensity detecting unit 01 can be applied to fields such as fingerprint identification devices, X-ray detection, vein recognition, and the like, which is not limited by this application.

It can be seen from the above that the first transistor M1 and the second transistor M2 do not need to drive a load, but only need to realize the signal transmission from the first electrode (or second electrode) to the second electrode (or first electrode) of the transistor in the on-state. Therefore, the sizes of the first transistor M1 and the second transistor M2 described above do not need to be large. In order to reduce the manufacturing difficulty and optimize the wiring space, optionally, the first transistor M1 and the second transistor M2 have the same width-to-length ratio.

When the width to length ratio of the first transistor M1 and the second transistor M2 are the same, the maximum leakage current that the second transistor M2 can allow is the same as the magnitude of the leakage current of any of the first transistors M1 connected to the second transistor M2. In this way, it is possible to effectively reduce the leakage current flowing to the reading signal line RL while simplifying the manufacturing process.

On the basis of this, when the light intensity detecting unit 01 comprises a plurality of gating circuits 20, in order to optimize the wiring space, optionally, as shown in FIG. 1, the plurality of gating circuits 20 connected to the same reading signal line RL are connected to different enable signal lines EN. In this way, when different enable signal lines EN output enable signals according to different timings, the gating circuit 20 can output signals to the same reading signal line RL at different times. For example, two gating circuits 20 connected to the same reading signal line RL1 are respectively connected to the enable signal line EN1 and the enable signal line EN2, and the enable signal line EN1 and the enable signal line EN2 can output signal to the same reading signal line at different times In addition, an enable signal line EN can be connected to multiple gating circuits and thus control the electric signal output to multiple reading signal lines. In other words, the plurality of gating circuits 20 connected to the plurality of photoelectric conversion circuits 10 connected to the same scanning signal line GL (for example, scanning signal line GL1) may be connected to the same enable signal line EN (for example, enable signal line EN1). In this way, the same enable signal line EN can simultaneously turn on multiple gating circuits 20. Moreover, under the control of the same scanning signal line GL, the plurality of photoelectric conversion circuits 10 that are turned on can simultaneously output the resulted electric signals to different reading signal lines RL through the turned-on gating circuits 20 connected to the photoelectric conversion circuits 10.

Figure 3:
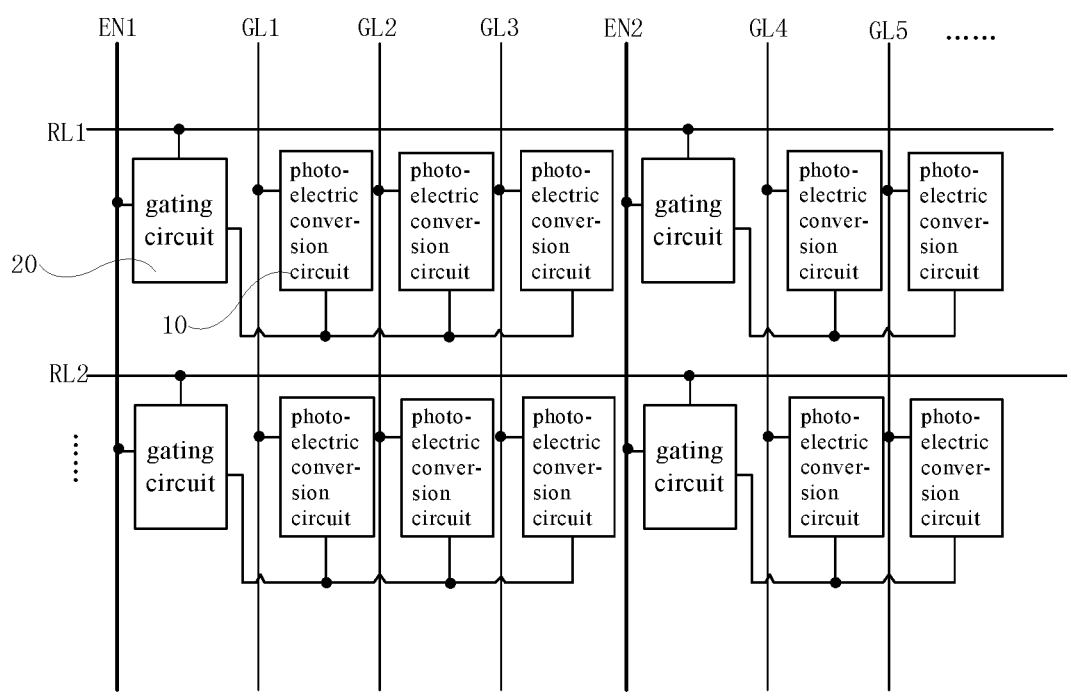
FIG. 3 schematically shows the structure of another light intensity detecting unit according to embodiments of the present disclosure.

In some embodiments, as shown in FIG. 1, the number of the photoelectric conversion circuits 10 connected to each of the gating circuits 20 may be the same. For example, each gating circuit 20 can be connected to three photoelectric conversion circuits 10. FIG. 3 schematically shows the structure of another light intensity detecting unit 02 according to embodiments of the present disclosure. As shown in FIG. 3, the different gating circuits 20 connect different numbers of photoelectric conversion circuits 10, which is not limited by this application.

The following detailed description is based on an example in which the number of the photoelectric conversion circuits 10 connected to each gating circuit 20 is the same.

Figure 4:
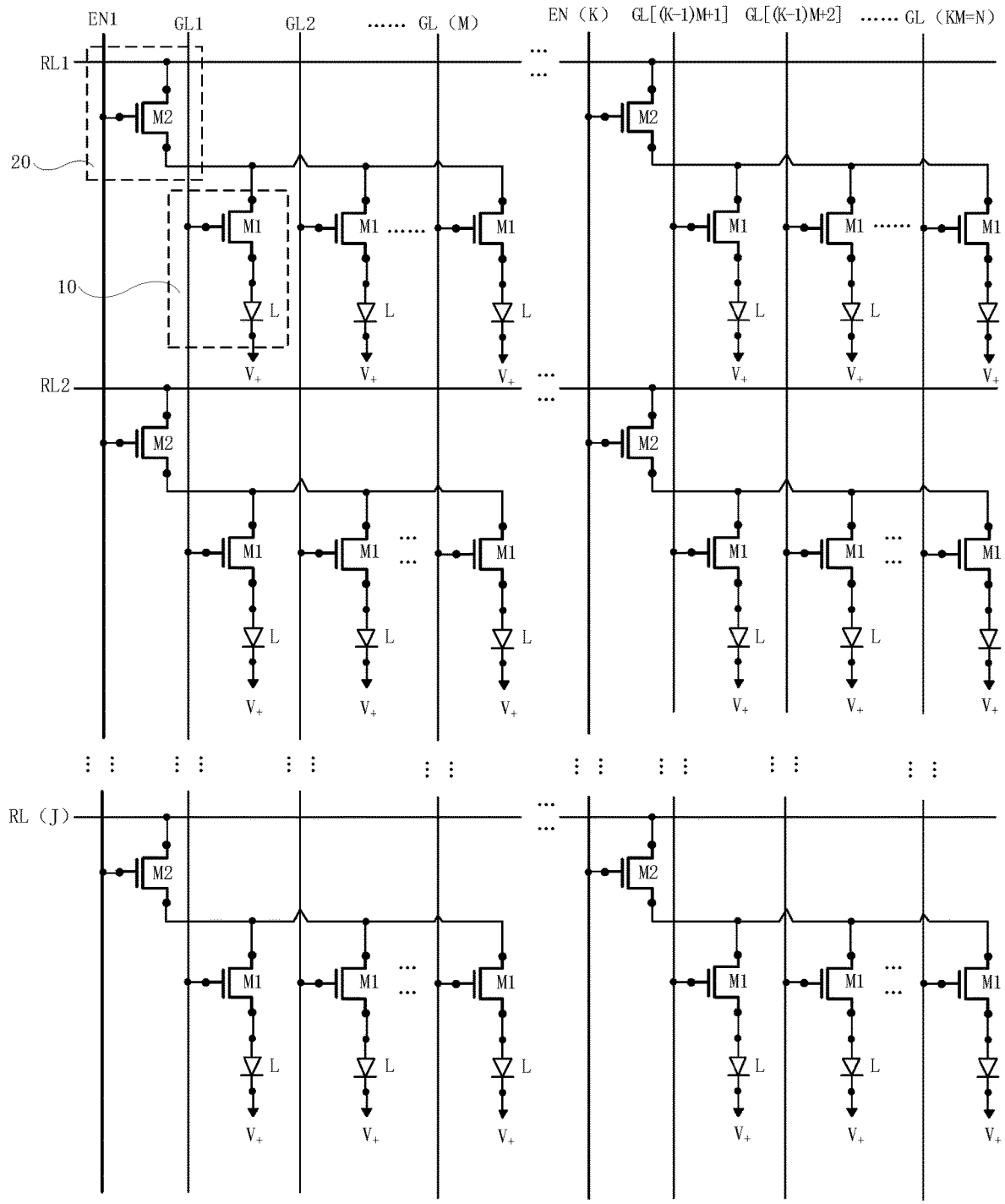
FIG. 4 schematically shows another wiring diagram of the photoelectric conversion circuits of FIG. 1.

FIG. 4 schematically shows another wiring diagram of the photoelectric conversion circuits 10 of FIG. 1. As shown in FIG. 4, in the light intensity detecting unit 01, the photoelectric conversion circuits 10 are divided into K groups based on the enable signal lines EN, and K is a positive integer. Based on this, the light intensity detecting unit 01 comprises K enable signal lines EN and K×J gating circuits 20.

At this time, the N photoelectric conversion circuits 10 connected to the same reading signal line RL can also be divided into K groups based on the enable signal lines EN. Each group of photoelectric conversion circuits 10 includes M photoelectric conversion circuits 10. The photoelectric conversion circuits 10 in each group is connected to a reading signal line RL through a gating circuit 20, and different groups of photoelectric conversion circuits 10 are connected to different gating circuits 20. As can be seen from the above, each group is composed of M photoelectric conversion circuits 10, and in such case K×M=N. In an embodiment, both M and K are greater than two.

Figure 5:
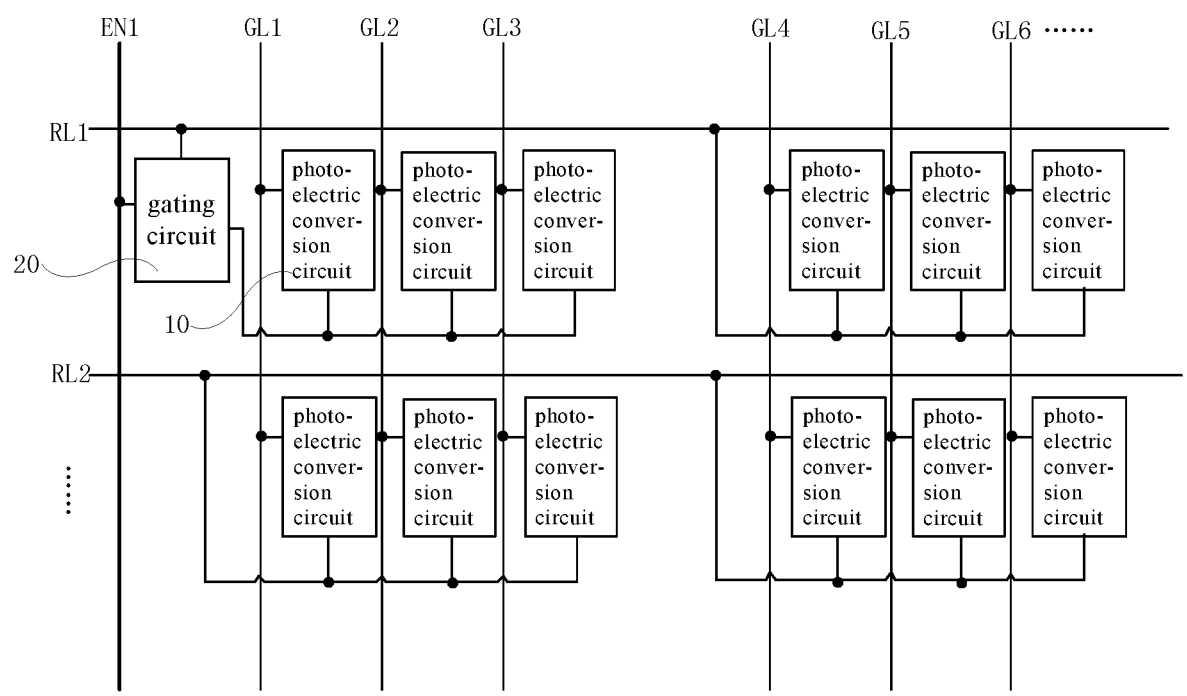
FIG. 5 schematically shows the structure of yet another light intensity detecting unit according to embodiments of the present disclosure.

In yet another embodiment, the light intensity detecting unit according to the present disclosure may include only one gating circuit. FIG. 5 schematically shows the structure of yet another light intensity detecting unit 03 according to embodiments of the present disclosure. As can be seen from FIG. 5, only part of the photoelectric conversion circuits is connected to the gating circuit. When the photoelectric conversion circuit not connected to the gating circuit receives the scanning signals from the scanning signal lines, the off-state current $I_{off}$ of the photoelectric conversion circuits connected to the gating circuit is also limited.

Figure 6:
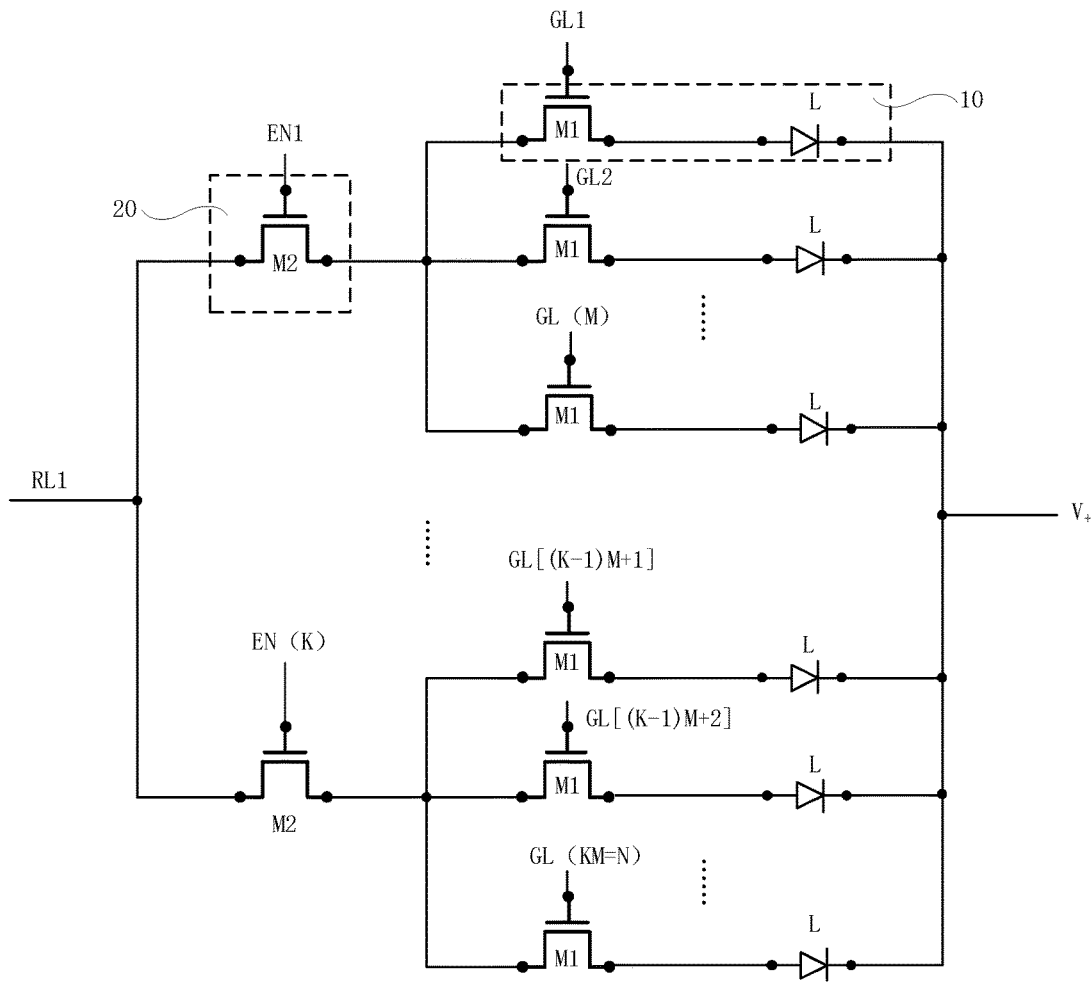
FIG. 6 schematically shows a circuit diagram of a plurality of gating circuits connected to the same reading signal line and the photoelectric conversion circuits connected to the gating circuits.

FIG. 6 schematically shows a circuit diagram of a plurality of gating circuits 20 connected to the same reading signal line RL (e.g., reading signal line RL1) and the photoelectric conversion circuits 10 connected to the gating circuits 20. As can be seen from FIG. 6, the output terminals of the M photoelectric conversion circuits 10 in the same group are connected to the same gating circuit 20. The output terminal of the photoelectric conversion circuit refers to the port that outputs the electric signal generated by the photoelectric conversion circuit.

In this case, when only one of the K gating circuits 20 connected to the same reading signal line RL1 is turned on, and only one of the M photoelectric conversion circuits 10 connected to the turned-on gating circuit 20 has a turned-on first transistor M1, among the first transistors M1 of the connected to the turned-on gating circuit, except for the turned-on first transistor, the remaining M−1 transistors generate off-state currents $I_{off}$, and the K−1 gating circuits that are not turned on also produces off-state currents $I_{off}$. Therefore, the total leakage current $I_{nosie}$ on each reading signal line RL is:

$$I_{noise}=[(K-1)+(M-1)]\times I_{off} \quad (1)$$

wherein, $I_{off}$ is the leakage current of any transistor. It should be noted that the basis of the formula (1) is that the width-to-length ratios of the first transistor M1 and the second transistor M2 are the same. Specifically, in the formula (1), as described above, K−1 second transistors M2 are turned off. In such situation, the K−1 second transistors M2 in the off-state may limit the magnitude of the current flowing to the reading signal line RL1 among the off-state currents of the first transistors M1 of the plurality of photoelectric conversion circuits 10 connected to the K−1 second transistors M2, thereby achieving the purpose of reducing the leakage current flowing to the reading signal line RL1.

Following is a description of a process in which the leakage currents of the plurality of first transistors M1 connected to the cut-off second transistor M2 flowing to the reading signal line RL is limited when the second transistor M2 is turned off.

Specifically, as shown in FIG. 6, the output terminals of the plurality of first transistors M1 connected to the same second transistor M2 are electrically connected, and the M first transistors M1 are respectively connected in series with the second transistor M2 to which they are commonly connected. Therefore, in the case where the first transistor M1 and the second transistor M2 have the same size, and the leakage current values of the first transistor M1 and the second transistor M2 are both $I_{off}$, the second transistor M2 in the off-state allows only the leakage currents of a portion of the M first transistors M1 to pass, and the maximum value of the leakage current that passes is the above $I_{off}$.

Figure 7:
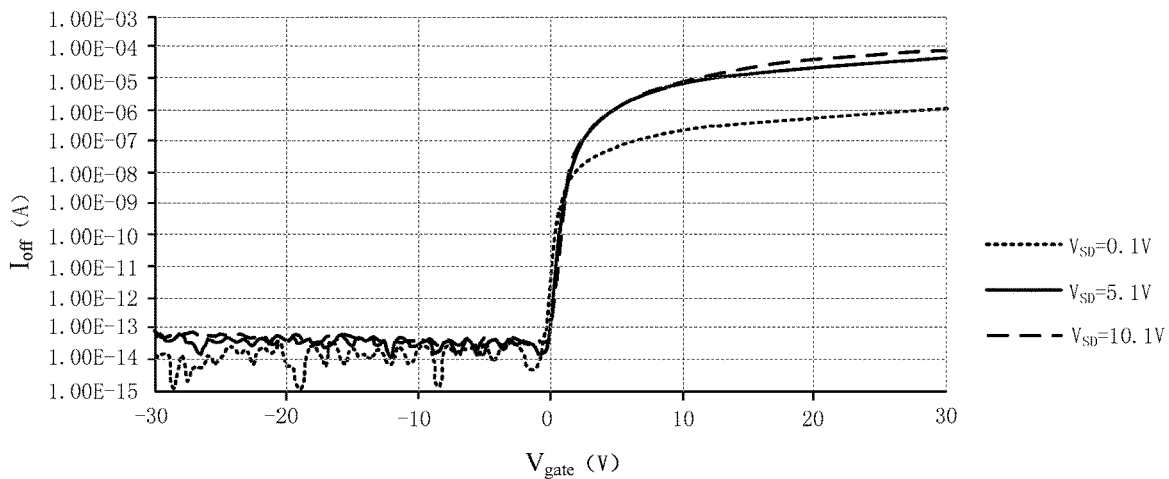
FIG. 7 schematically shows a graph obtained from an IV curve test of a second transistor in the light intensity detecting unit according to the embodiments of the present application.

FIG. 7 schematically shows a graph obtained from an IV curve test of a second transistor M2 in the light intensity detecting unit 01 according to the embodiments of the present application. As shown in FIG. 7, when, among the plurality of first transistors M1 connected to the second transistor M2, the number of the first transistor M1 in the off-state and the number of the first transistor M1 in the on-state change, the voltage drop $V_{SD}$ on the second transistor M2 changes, but the change of the $V_{SD}$ does not have a large effect on the leakage current $I_{off}$ of the second transistor M2. Therefore, the magnitude of the leakage current allowed by the second transistor M2 does not change greatly on the basis of the turn-on or turn-off of the transistors of the M first transistors M1 connected to the second transistors M2.

In addition, among the M photoelectric conversion circuits 10 connected to the same turned-on gating circuit 20, only one photoelectric conversion circuit 10 has a turned-on first transistor M1, and the leakage currents of the rest M−1 turned-off first transistors M1 can flow to the above reading signal lines RL1 through the turned-on second transistor M2.

Following is an example of the principle that the light intensity detecting unit according to the embodiments of the present application reduces the interference signal on each reading signal line RL.

Specifically, it is assumed that the leakage current $I_{off}$ of the first transistor M1 or the second transistor M2 is $1\times10^{-13}$ A, and the photocurrent of the photoelectric conversion element L is $I_{PIN}=1\times10^{-11}$ A. Meanwhile, assume that the number N of photoelectric conversion circuits 10 in the light intensity detecting unit 01 that input electric signals to the same reading signal line RL is 900, i.e., N=900. In this case, when the light transistor detecting unit 01 does not have the second transistor M2, and only one of the first transistors M1 connected to the same reading signal line RL is turned on, the total leakage current $I_{nosie}'$ on line RL is:

$$I_{noice}'=(900-1)\times I_{off}=8.99\times10^{-11} A \quad (2)$$

In that situation, the signal-to-noise ratio is $$R'=I_{PIN}/I_{noice}'\approx 0.11 \quad (3).$$

As can be seen from the formula (3), in the case where the above second transistor M2 is not provided, the signal-to-noise ratio R' is relatively small. Therefore, the noise of the output signal on the reading signal line RL is relatively large, and the signal detection accuracy is low.

When using the solution provided by the embodiments of the present application, assume that the number K of second transistors M2 connected to the same reading signal line RL is 30, i.e., K=30, and the number M of photoelectric conversion circuits included in each group of photoelectric conversion circuits is 30, i.e., M=K=30, and only one of the 30 second transistors M2 is turned on, and only one of the 30 first transistors M1 connected to the turned-on second transistor M2 is turned on. In that situation, as can be seen from the above formula (1), the total leakage current $I_{nosie}$ on the reading signal line RL is:

$$I_{noice}=[(30-1)+(30-1)]\times I_{off}=5.8\times10^{-12} A$$

In that situation, the signal-to-noise ratio is:

$$R=I_{PIN}/I_{noice}\approx 1.72 \quad (4)$$

As can be seen from the formula (4), in the case that the above second transistor M2 is included, the signal-to-noise ratio R is increased, and R≈15.5R'. Therefore, the noise of the output signal on the reading signal line RL of the light intensity detecting unit according to the embodiments of the present disclosure is remarkably reduced, thereby is good for the improvement of the detection accuracy.

In addition, according to the mathematic equation $a^2+b^2\geq 2ab$, it can be acquired that:

$$I_{noise}=[(K-1)+(M-1)]=I_{off}\geq 2\sqrt{(K-1)(M-1)}\times I_{off} \quad (5)$$

When K−1=M−1, the two sides of the above formula (5) are equal. In this situation, the leakage current $I_{nosie}$ is the minimum. Therefore, it can be concluded that when the value of K is equal to the value of M, the total leakage current $I_{nosie}$ on each reading signal line RL is the smallest.

Figure 8:
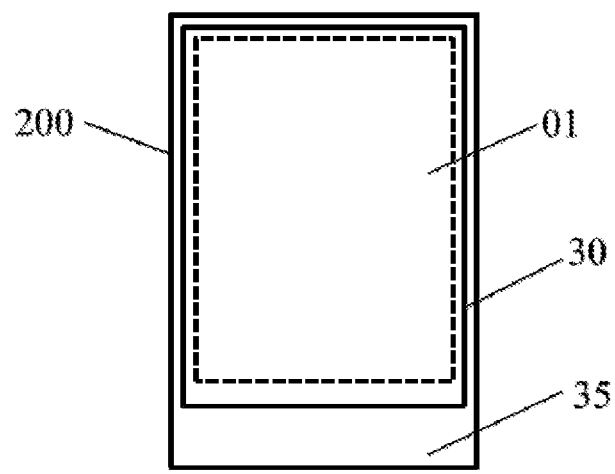
FIG. 8 schematically shows the structure of a display panel according to the embodiments of the present disclosure.
Figure 9:
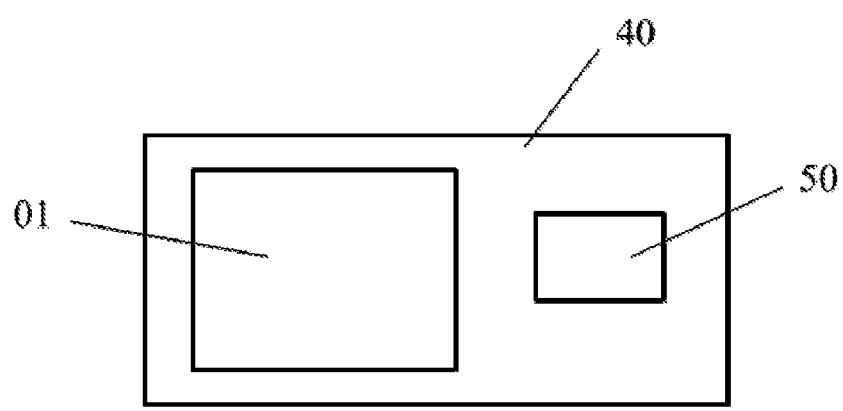
FIG. 9 schematically shows the structure of the fingerprint identification circuit.

The embodiments of the present application further provide a display panel. The display panel comprises a fingerprint identification circuit 40. The fingerprint identification circuit 40 comprises the light intensity detecting unit 01 according to any of the above embodiments. FIG. 8 schematically shows the structure of the display panel 200 according to the embodiments of the present disclosure. The light intensity detecting unit 01 is located in the display area 30 of the display panel 200 or the non-display area 35 of the display panel 200, which is not limited by this application. The light intensity detecting unit 01 constitutes a part of the fingerprint identification circuit 40. In an embodiment, the fingerprint identification circuit 40 further includes a processor 50 to process the electric signal from the light intensity detecting unit. FIG. 9 schematically shows the structure of the fingerprint identification circuit.

Optionally, when the light intensity detecting unit 01 is located in the display area of the display panel, the light intensity detecting unit 01 may be evenly distributed in the display area or be disposed in a part of the display area, which is not limited by the present application.

In the case where the light intensity detecting unit 01 is located in the display area of the display panel, when the display area of the display panel further includes the gate line gate and the data line Data that are crisscrossed, in order to avoid that multiple kinds of signal lines are arranged in the same layer which results in a crowded wiring space, as an option, the scanning signal line GL, the reading signal line RL, and the enable signal line EN in the light intensity detecting unit 01 may be located at different layers from the gate line or the data line It should be noted that the above display panel has the same technical effects as the light intensity detecting unit 01 provided in the foregoing embodiments, and details are not repeated here again.

The present disclosure also provides a method for detecting light intensity by using a light intensity detecting unit. The light intensity detecting unit comprises:

N scanning signal lines, wherein N is a positive integer,

J reading signal lines, where J is a positive integer, at least one enable signal line, N×J photoelectric conversion circuits configured to convert optical signals into electric signals, and at least one gating circuit, wherein each of the J reading signal lines is connected to one or more of the at least one gating circuit, each of the gating circuits is connected to output terminals of a plurality of the photoelectric conversion circuits, each of the N scanning signal lines is connected to one or more of the photoelectric conversion circuits, and each of the enable signal line is connected to one or more of the at least one gating circuit, wherein the gating circuit is configured to transmit the electric signal to the reading signal line connected thereto in response to an enable signal from the enable signal line connected thereto.

Figure 10:
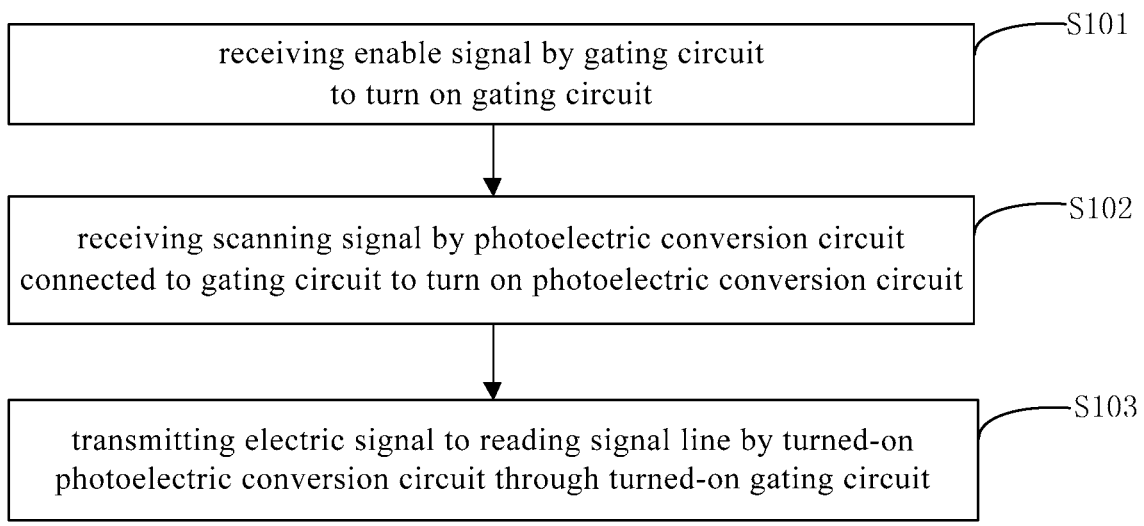
FIG. 10 schematically shows a flowchart of a method for detecting light intensity.

FIG. 10 schematically shows the steps of the method. In some embodiments, the method comprises:

S101:—receiving the enable signal by the gating circuit 20 to turn on the gating circuit 20, S102:—receiving a scanning signal by the photoelectric conversion circuit 10 connected to the gating circuit 20 to turn on the photoelectric conversion circuit 10, and S103:—transmitting the electric signal to the reading signal line RL by a turned-on photoelectric conversion circuit 10 through a turned-on gating circuit 20.

Specifically, the enable signal terminal EN(K) can control the second transistor M2 connected thereto to cut-off. At this time, the second transistor M2 can limit the amount of leakage currents of the plurality of first transistors M1 connected thereto which flow to the reading signal line RL, so that the magnitude of noise on the reading signal line RL can be reduced.

The scan mode of the scanning signal line GL includes: when the light intensity detecting unit 01 includes N scanning signal lines GL, the scanning signals are input to the photoelectric conversion circuits one by one by the N scanning signal lines GL, to turn on the photoelectric conversion circuit one by one.

The manner for the reading signal line RL to output signals includes: after a scanning signal line GL has input a scanning signal, transmitting the electric signals one by one by the gating circuit to the reading signal lines connected to the scanning signal line.

In this case, the above J reading signal lines RL can be output to the data processor through a data channel.

Alternatively, the manner for the reading signal line RL to output signals may be: after the scanning signal lines GL have input scanning signals, simultaneously transmitting the electric signals by the gating circuit to the reading signal line connected to the scanning signal line. At this time, the J reading signal lines RL can output to the data processor through different data channels.

In the situation that the photoelectric conversion circuits connected to the same one of the J reading signal lines are divided into K groups, where K is a positive integer greater than or equal to 2, and each group of the photoelectric conversion circuits consists of M photoelectric conversion circuits, and M=K, the step of receiving the enable signal by the gating circuit to turn on the gating circuit comprises inputting enable signals by K enable signal lines one by one to turn on the gating circuits one by one.

Next, when a plurality of gating circuits connected to the same enable signal line are turned on, the step of receiving a scanning signal by the photoelectric conversion circuit connected to the gating circuit to turn on the photoelectric conversion circuit comprises receiving the scanning signals one by one through the M scanning signal lines by the M photoelectric conversion circuits connected to the turned-on gating circuit to turn on the photoelectric conversion circuits one by one.

Figure 11:
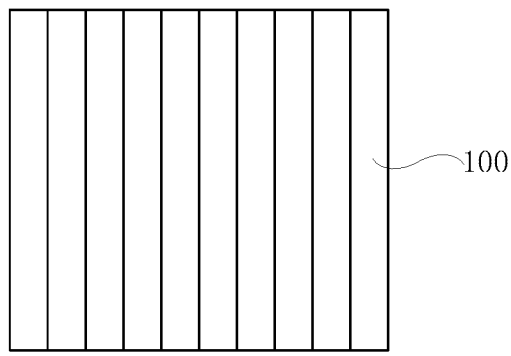
FIG. 11 schematically shows control areas of the light intensity detecting unit that have been divided.

FIG. 11 schematically shows the control areas of the light intensity detecting unit that have been divided. As shown in FIG. 11, the light intensity detecting unit 01 can be divided into a plurality of control areas 100. Each control area includes an enable signal line EN and M scanning signal lines GL. That is, each control area 100 includes one or more gating circuits 20 connected to the enable signal line EN and a group (of a total of M) of the photoelectric conversion circuits 10 connected to the gating circuit 20.

Figure 12:
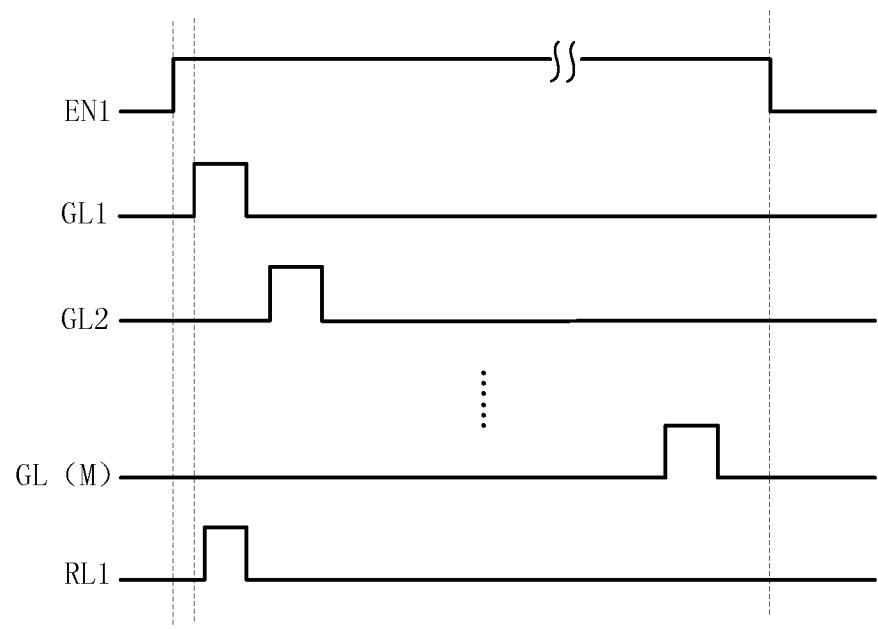
FIG. 12 schematically shows a signal timing diagram of signal lines of the light intensity detecting unit.

FIG. 12 schematically shows a signal timing diagram of the above-described enable signal line EN1 and the M scanning signal lines (GL1, GL2, GL3, . . . , GL(M)). As shown in FIG. 12, after the enable signal line EN1 outputs a high level, the M scanning signal lines (GL1, GL2, GL3, . . . , GL(M)) output high levels one by one, and the pulse width of the enable signal line EN1 is greater than the sum of the signal pulse widths of the M scanning signal lines (GL1, GL2, GL3, . . . GL(M)). As shown in FIG. 12, when the scanning signal lines GL1 output high levels, the reading signal line RL outputs current signals.

The embodiments of the present application provide a light intensity detecting unit, a display panel, and a method for detecting light intensity. Only when one gating circuit is turned on in the light intensity detecting unit, can each photoelectric conversion circuit connected to the gating circuit be turned on under the control of the scanning signal lines, thereby transmitting the electric signals one by one to the reading signal line connected to the turned-on gating unit. In this way, a part of the gating circuits can be selectively turned on. At the same time, a part of the gating circuits can be selectively turned off. In this case, the gating circuits in the off-state allows only a part of the transistor leakage currents of the plurality of photoelectric conversion circuits connected thereto to pass, because the leakage current that can flow to the reading signal line through the gating circuit is limited by the leakage current of the transistor in the gating circuit. Therefore, the gating circuit can limit the off-state current transmitted to the reading signal line, thereby reducing the influence of the off-state current on the signal collected on the reading signal line, and improving the detection accuracy of the light intensity detecting unit.

It should be understood that the plural forms of the elements in the claims and the specification are not intended to limit the quantity of the elements to a plurality, unless specifically identified. The above content is only specific embodiments of the present disclosure, but the scope of protection of the present disclosure is not limited thereto. Any modification or substitution that may be easily conceived by those skilled in the art within the scope of the present disclosure is covered within the protection scope of the present disclosure. The protection scope of the disclosure should be determined by the protection scope of the claims.

We claim:

1. A light intensity detecting unit, comprising:
   N scanning signal lines, wherein N is a positive integer;
   J reading signal lines, wherein J is a positive integer;
   at least one enable signal line;
   N×J photoelectric conversion circuits configured to convert optical signals into electric signals, wherein each of the photoelectric conversion circuits comprises a first transistor and a photoelectric conversion element, the first transistor comprises a gate electrode, a first electrode and a second electrode, the gate electrode of the first transistor is connected to one of the scanning signal lines, the photoelectric conversion element is connected to the first electrode of the first transistor, the second electrode of the first transistor is an output terminal of the photoelectric conversion circuit; and
   at least one gating circuit, wherein each of the at least one gating circuit comprises a second transistor, the second transistor comprises a gate electrode, a first electrode and a second electrode, the gate electrode of the second transistor is connected to one of the at least one enable signal line, the first electrode of the second transistor is connected to the second electrode of the first transistor, and the second electrode of the second transistor is connected to one of the reading signal lines,
   wherein each of the reading signal lines is connected to one or more of the at least one gating circuit,
   wherein each of the at least one gating circuit is connected to output terminals of a plurality of the photoelectric conversion circuits,
   wherein each of the scanning signal lines is connected to one or more of the photoelectric conversion circuits,
   wherein each of the at least one enable signal line is connected to one or more of the at least one gating circuit, and
   wherein the at least one gating circuit is configured to transmit a respective one of the electric signals to a corresponding one of the reading signal lines that is connected to a corresponding one of the at least one gating circuit in response to an enable signal from the at least one enable signal line connected to the corresponding one of the at least one gating circuit.

2. The light intensity detecting unit of claim 1,
   wherein the photoelectric conversion circuits connected to a same reading signal line is divided into K groups, wherein K is a positive integer greater than or equal to 2, and
   wherein the photoelectric conversion circuits in each one of the groups are connected to a same gating circuit.

3. The light intensity detecting unit of claim 2,
   wherein in each of the groups of the photoelectric conversion circuits, each of the scanning signal lines is connected to a corresponding one of the photoelectric conversion circuits.

4. The light intensity detecting unit of claim 3,
   wherein each of the groups of the photoelectric conversion circuits comprises M photoelectric conversion circuits, wherein M is a positive integer.

5. The light intensity detecting unit of claim 4, wherein M=K.

6. The light intensity detecting unit of claim 1, wherein N is a positive integer greater than or equal to 3.

7. The light intensity detecting unit of claim 1,
   wherein the at least one gating circuit comprises a plurality of gating circuits, and
   wherein the gating circuits connected to a same reading signal line are respectively connected to different ones of the at least one enable signal line.

8. The light intensity detecting unit of claim 1,
   wherein the at least one gating circuit comprises a plurality of gating circuits, and
   wherein the gating circuits connected to a same one of the at least one enable signal line are respectively connected to different ones of the reading signal lines.

9. The light intensity detecting unit of claim 1, wherein the first transistor and the second transistor have a same width-to-length ratio.

10. The light intensity detecting unit of claim 1,
    wherein the photoelectric conversion element comprises a photodiode, and the first electrode of the first transistor is connected to an anode of the photodiode, and a cathode of the photodiode is connected to an operating voltage terminal.

11. The light intensity detecting unit of claim 1, wherein one of the at least one enable signal line is parallel to the scanning signal line.

12. A display panel, comprising:
    a fingerprint identification circuit comprising the light intensity detecting unit according to claim 1.

13. The display panel of claim 12, wherein the light intensity detecting unit is in a display area of the display panel.

14. The display panel of claim 13, further comprising:
    a gate line and a data line that are crisscrossed,
    wherein ones of the scanning signal lines, ones of the reading signal lines and the at least one enable signal line are at a different layer than the gate line or the data line.

15. A method of detecting light intensity by using a light intensity detecting unit, wherein the light intensity detecting unit comprises:

N scanning signal lines, wherein N is a positive integer;
J reading signal lines, where J is a positive integer;
at least one enable signal line;
N×J photoelectric conversion circuits configured to convert optical signals into electric signals, wherein each of the photoelectric conversion circuits comprises a first transistor and a photoelectric conversion element, the first transistor comprises a gate electrode, a first electrode and a second electrode, the gate electrode of the first transistor is connected to one of the scanning signal lines, the photoelectric conversion element is connected to the first electrode of the first transistor, the second electrode of the first transistor is an output terminal of the photoelectric conversion circuit; and
at least one gating circuit, wherein each of the at least one gating circuit comprises a second transistor, the second transistor comprises a gate electrode, a first electrode and a second electrode, the gate electrode of the second transistor is connected to one of the at least one enable signal line, the first electrode of the second transistor is connected to the second electrode of the first transistor, and the second electrode of the second transistor is connected to one of the reading signal lines,
wherein each of the reading signal lines is connected to one or more of the at least one gating circuit,
wherein each of the at least one gating circuit is connected to output terminals of a plurality of the photoelectric conversion circuits,
wherein each of the scanning signal lines is connected to one or more of the photoelectric conversion circuits,
wherein each of the at least one enable signal line is connected to one or more of the at least one gating circuit,
wherein the at least one gating circuit is configured to transmit a respective one of the electric signals to a corresponding one of the reading signal lines that is connected to a corresponding one of the at least one gating circuit in response to an enable signal from the at least one enable signal line connected to the corresponding one of the at least one gating circuit,
the method comprising:
receiving the enable signal by the at least one gating circuit to turn on the at least one gating circuit,
receiving a scanning signal by the photoelectric conversion circuit connected to the at least one gating circuit to turn on the photoelectric conversion circuit, and
transmitting the respective one of the electric signals to the corresponding one of the reading signal lines by a turned-on photoelectric conversion circuit through a turned-on one of the at least one gating circuit.

16. The method of claim 15, wherein the receiving the scanning signal by the photoelectric conversion circuit connected to the at least one gating circuit to turn on the photoelectric conversion circuit comprises:
receiving one by one, by the photoelectric conversion circuits connected to the at least one gating circuit, the scanning signals transmitted by the scanning signal lines connected to the photoelectric conversion circuits, to turn on the photoelectric conversion circuits one by one.

17. The method of claim 16, wherein the transmitting the electric respective one of the electric signals to the corresponding one of the reading signal lines by the turned-on gating circuit comprises:
after the photoelectric conversion circuits have received the scanning signals, transmitting, by the at least one gating circuit, the electric signals to corresponding ones of the reading signal lines one by one or simultaneously.

18. The method of claim 16, wherein the receiving the enable signal by the at least one gating circuit to turn on the at least one gating circuit comprises:
inputting a plurality of enable signals comprising the enable signal one by one to the at least one gating circuit by the at least one enable signal line to turn on the at least one gating circuit one by one;
wherein in response to a plurality of gating circuits comprising the at least one gating circuit connected to a same enable signal line of the at least one enable signal line being turned on, the receiving the scanning signal by the photoelectric conversion circuit connected to the at least one gating circuit to turn on the photoelectric conversion circuit comprises:
receiving one by one, by the photoelectric conversion circuits connected to the turned-on gating circuit, the scanning signals transmitted by the scanning signal lines connected to the photoelectric conversion circuits, to turn on the photoelectric conversion circuits one by one.

* * * * *